US012801041B2

(12) United States Patent
Park et al.

(10) Patent No.: US 12,801,041 B2
(45) Date of Patent: Nov. 17, 2026

(54) WAFER ALIGNMENT SYSTEM AND WAFER ALIGNMENT METHOD

(71) Applicant: SAMSUNG ELECTRONICS CO., LTD., Suwon-si (KR)

(72) Inventors: Sangyun Park, Suwon-si (KR); Junghyun Park, Suwon-si (KR); Byunghoon Ko, Suwon-si (KR); Sungsoo Kim, Suwon-si (KR); Seungwoo Noh, Suwon-si (KR); Jinwoo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 18/753,763

(22) Filed: Jun. 25, 2024

(65) Prior Publication Data

US 2025/0060685 A1 Feb. 20, 2025

(30) Foreign Application Priority Data

Aug. 14, 2023 (KR) ........................ 10-2023-0106460

(51) Int. Cl.
*G03F 9/00* (2006.01)
*H10W 46/00* (2026.01)

(52) U.S. Cl.
CPC .......... *G03F 9/7076* (2013.01); *G03F 9/7046* (2013.01); *H10W 46/00* (2026.01)

(58) Field of Classification Search
CPC .... G03F 9/7076; G03F 9/7046; H10W 46/00; H10W 46/301; H10P 72/0606; H10P 72/57; H10P 72/53; H10P 72/7616
USPC .......................................................... 356/401
See application file for complete search history.

(56) References Cited

U.S. PATENT DOCUMENTS

| | | | | |
|---|---|---|---|---|
| 4,475,122 | A | 10/1984 | Green | |
| 4,819,167 | A | 4/1989 | Cheng et al. | |
| 2009/0180314 | A1 * | 7/2009 | Liu | G11C 13/0004 257/E47.001 |
| 2010/0071206 | A1 * | 3/2010 | Kerr | H10W 72/072 29/829 |
| 2019/0325601 | A1 | 10/2019 | Chen et al. | |
| 2020/0174060 | A1 | 6/2020 | Mochizuki et al. | |
| 2020/0185603 | A1 * | 6/2020 | Chen | H10N 70/041 |
| 2022/0277981 | A1 * | 9/2022 | Amikura | H01J 37/32642 |
| 2022/0283034 | A1 * | 9/2022 | Schieferdecker | G01J 5/12 |
| 2022/0350263 | A1 * | 11/2022 | Chen | G03F 7/70775 |
| 2022/0402087 | A1 * | 12/2022 | Fukunaga | B24B 7/04 |
| 2023/0049255 | A1 * | 2/2023 | Yang | H10F 39/809 |
| 2023/0065325 | A1 | 3/2023 | Uchiyama et al. | |

(Continued)

FOREIGN PATENT DOCUMENTS

| | | | |
|---|---|---|---|
| JP | 7-27953 | B2 | 3/1995 |
| JP | 6785186 | B2 | 11/2020 |

(Continued)

*Primary Examiner* — Md M Rahman
(74) *Attorney, Agent, or Firm* — Sughrue Mion, PLLC

(57) ABSTRACT

A wafer alignment system includes a wafer sensor including a wafer substrate and a phase change material layer provided on the wafer substrate, a support member to support and heat the wafer sensor, a transfer device to transfer the wafer sensor to the support member, and a measurement device to analyze crystal information of the phase change material layer of the wafer sensor and control the transfer device.

15 Claims, 6 Drawing Sheets

(56) References Cited

U.S. PATENT DOCUMENTS

| | | | | |
|---|---|---|---|---|
| 2023/0119986 A1* | 4/2023 | Osaka | .................... | B65G 47/90<br>414/751.1 |
| 2023/0314827 A1* | 10/2023 | Devlin | .................. | B82Y 20/00<br>359/485.01 |

FOREIGN PATENT DOCUMENTS

| | | | | |
|---|---|---|---|---|
| KR | 2024-0144371 | A | * | 10/2024 |
| TW | I513073 | B | * | 12/2015 |
| WO | 2022/163806 | A1 | | 8/2022 |

* cited by examiner

WAFER ALIGNMENT SYSTEM AND WAFER ALIGNMENT METHOD

CROSS-REFERENCE TO RELATED APPLICATION

This application is based on and claims priority under 35 U.S.C. § 119 to Korean Patent Application No. 10-2023-0106460, filed on Aug. 14, 2023, in the Korean Intellectual Property Office, the disclosure of which is incorporated by reference herein in its entirety.

BACKGROUND

1. Field

The disclosure relates to a wafer alignment system and a wafer alignment method.

2. Description of the Related Art

Typically, a semiconductor manufacturing process may include operations such as a photolithography process, wafer probing, wafer testing, wafer mounting, and dicing for generating devices, conductors, and insulators on a wafer. In During the semiconductor manufacturing process, a substrate must have a precise alignment with respect to manufacturing equipment. A defect of alignment may lead to deterioration in yield. For example, because alignment may deteriorate due to accumulation of mechanical errors over time, it is necessary to properly evaluate the deteriorated alignment and control a substrate transfer system.

A wafer-type sensor system may be provided for collecting alignment information during a semiconductor manufacturing process. The wafer-type sensor may be provided with a related art equipment for manufacturing a semiconductor device. The wafer-type sensor system may be mounted within an entire transfer system, which increases the complexity of the entire system, and the addition of an alignment system has the limitation of requiring changes to expensive semiconductor equipment/transfer systems.

SUMMARY

Provided is a wafer alignment system including a wafer type sensor including a phase change material layer and a wafer alignment method.

Additional aspects will be set forth in part in the description which follows and, in part, will be apparent from the description, or may be learned by practice of the presented embodiments of the disclosure.

According to an aspect of the disclosure, there is provided a wafer alignment system including: a wafer sensor including a wafer substrate and a phase change material layer provided on the wafer substrate; a support member configured to support the wafer sensor and heat the wafer sensor; and a transfer device configured to transfer the wafer sensor to the support member.

The phase change material layer may be configured to store pattern information and edge information based on the support member.

The wafer alignment system may further include: a barrier layer provided between the wafer substrate and the phase change material layer.

The phase change material layer may include GeSbTe (GST).

The wafer alignment system may further include: a measurement station configured to analyze crystal information of the phase change material layer of the wafer sensor and control the transfer device.

The measurement station may be configured to electrically measure a change in electrical characteristics of the phase change material layer.

The measurement station may be configured to optically measure a change in optical characteristics of the phase change material layer.

The measurement station may be configured to initialize the wafer sensor by causing a phase change uniformly throughout the phase change material layer.

According to another aspect of the disclosure, there is provided a wafer alignment system including: a wafer sensor including a wafer substrate, a first phase change material pattern provided on the wafer substrate, and a second phase change material pattern, the first phase change material pattern including a plurality of first phase change material portions and the second phase change material pattern including a plurality of second phase change materials; a support member configured to support the wafer sensor and heat the wafer sensor; and a transfer device configured to transfer the wafer sensor to the support member.

The second phase change material pattern may be provided to be symmetrical to the first phase change material pattern with respect to a center of the wafer substrate.

The wafer sensor may further include a third phase change material pattern provided on the wafer substrate and a fourth phase change material pattern, wherein the third phase change material pattern includes a plurality of third phase change material portions, wherein the fourth phase change material pattern includes a plurality of fourth phase change material portions, and wherein the third phase change material pattern is provided to be symmetrical to the fourth phase change material pattern with respect to a center of the wafer substrate.

The wafer sensor may further include a third phase change material pattern provided on the wafer substrate, the third phase change material pattern including a plurality of third phase change material portions, and the first phase change material pattern, the second phase change material pattern, and the third phase change material pattern may be provided at intervals of 120 degrees with respect to a center of the wafer substrate.

The plurality of first phase change material portions may be provided along an edge of the wafer substrate.

One or more of the plurality of first phase change material portions may overlap the edge of the wafer substrate.

The wafer alignment system may be further include: a measurement station configured to analyze crystal information of the first phase change material pattern and the second phase change material pattern and control the transfer device.

The measurement station may be configured to electrically measure a change in electrical characteristics of the first phase change material pattern and the second phase change material pattern or optically measure a partial change in optical characteristics of the first phase change material pattern and the second phase change material pattern.

According to another aspect of the disclosure, there is provided a wafer alignment method including: loading a wafer sensor onto a support member, the wafer sensor including a wafer substrate and a phase change material layer; heating, by the support member, the phase change material layer to a temperature equal to or greater than a crystallization temperature of the phase change material layer; causing a phase change in a portion of the phase change material layer contacting the support member based on the heating by the support member; and unloading the wafer sensor from the support member.

The wafer alignment method may further include analyzing a change in the phase change material layer with a measurement device, and controlling the transfer device according to the analyzing.

The wafer alignment method may further include analyzing of the change in the phase change material layer with the measurement device includes electrically measuring a partial change in electrical characteristics of the phase change material layer, or optically measuring a partial change in optical characteristics of the phase change material layer, and accordingly quantifying a degree of alignment of the wafer sensor.

The wafer alignment method may further include, after the analyzing of the change in the phase change material layer with the measurement device, initializing a measurement history of the wafer sensor by forming a phase change uniformly throughout the phase change material layer.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Figure 1:
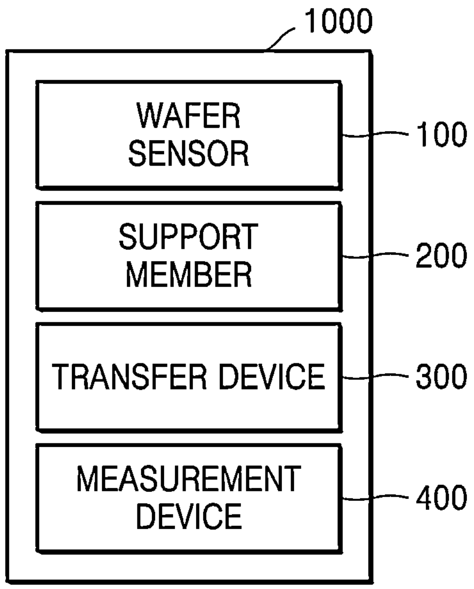
FIG. 1 is a block diagram showing a wafer alignment system according to an embodiment.

Reference will now be made in detail to embodiments, examples of which are illustrated in the accompanying drawings, wherein like reference numerals refer to like elements throughout. In this regard, the embodiments of the disclosure may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a wafer alignment systems and a wafer alignment method according to some embodiments will be described in detail with reference to the accompanying drawings. Like reference numerals in the drawings denote like elements, and the size of each element in the drawings may be exaggerated for clarity and convenience of description. Meanwhile, embodiments described below are merely examples, and various modifications may be made from these embodiments.

Hereinafter, what is described as "above" or "on" may include those directly on, underneath, left, and right in contact, as well as above, below, left, and right in non-contact. The singular forms are intended to include the plural forms as well, unless the context clearly indicates otherwise. Also, when a part "includes" any element, it means that the part may further include other elements, rather than excluding other elements, unless otherwise stated.

The term "the" and the similar indicative terms may be used in both the singular and the plural. If there is no explicit description of the order of steps constituting a method or no contrary description thereto, these steps may be performed in an appropriate order, and are not limited to the order described.

Connections of lines or connection members between elements shown in the drawings are illustrative of functional connections and/or physical or circuitry connections, and may be replaced in an actual device, or may be represented as additional various functional connections, physical connections, or circuitry connections.

The use of all examples or example terms is merely for describing the technical concept in detail, and the scope thereof is not limited by these examples or example terms unless limited by claims.

Figure 2:
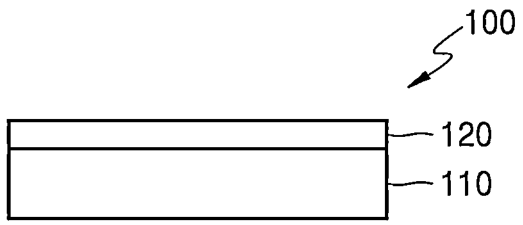
FIG. 2 is a diagram showing a wafer sensor according to an embodiment.

FIG. 1 is a block diagram showing a wafer alignment system 1000 according to an embodiment. FIG. 2 is a diagram showing a wafer sensor 100 according to an embodiment;

Referring to FIG. 1, the wafer alignment system 1000 may include a wafer sensor 100, a support member 200 configured to support the wafer sensor 100, a transfer device 300 configured to transfer the wafer sensor 100 to support member, and a measurement device 400 configured to analyze information related to the wafer sensor 100.

Referring to FIG. 2, the wafer sensor 100 may include a wafer substrate 110 and a phase change material layer 120.

The wafer substrate 110 may have a shape of a wafer. The wafer substrate 110 may be formed to have a size and shape corresponding to the wafer. The wafer substrate 110 may have a circular plate shaped like a wafer. The wafer substrate 110 may include a material with a low heat transfer coefficient. For example, the material may have a heat transfer coefficient lower than a reference value. The wafer substrate 110 may include the material with the low heat transfer coefficient in order to minimize a phenomenon in which a pattern on the phase change material layer 120 spreads heat to the waver substrate due to a heat transfer. The wafer substrate 110 may be, for example, a silicon wafer.

The phase change material layer 120 may be provided on the wafer substrate 110. For example, the phase change material layer 120 may be provided on a portion of the wafer substrate 110 or entirety of the wafer substrate 110. The phase change material layer 120 may be provided to partly the wafer substrate 110 or wholly cover the wafer substrate 110.

The phase change material layer 120 may have electrical or optical properties that change according to a phase change. For example, the term phase change may refer to a change in a state of material from a first state to a second state. The phase change material layer 120 may change resistance or optical refractive index according to the phase change. The phase change material layer 120 may include a phase change material that reversibly changes between an amorphous state and a crystalline state according to a heating time. The phase change material layer 120 may have different resistivity between the amorphous state and the crystalline state. The phase change material layer 120 may have a high resistance in the amorphous state and a low resistance in the crystalline state. For example, the phase change material layer 120 may have a first resistance in the amorphous state and a second resistance in the crystalline state, the first resistance is higher than the second resistance.

The phase change material layer 120 may include, for example, a GeSbTe (GST)-based material. For example, the GeSbTe (GST)-based material may be $Ge_2Sb_2Te_5$, $Ge_2Sb_2Te_7$, $GeSb_2Te_4$, or $GeSb_4Te_7$. However, the phase change material layer 120 is not limited thereto and may include any material that exhibits a phase change due to heat. The phase change material layer 120 may include, for example, a chalcogenide material including an element selected from silicon (Si), germanium (Ge), antimony (Sb), tellurium (Te), bismuth (Bi), indium (In), tin (Sn), and selenium (Se). Each element included in the chalcogenide material may have a variety of stoichiometry. According to the stoichiometry of the element, a phase change rate according to a crystallization temperature, melting point, and crystallization energy of the phase change material of the phase change material layer 120 may be adjusted. For example, the stoichiometry may be adjusted so that the crystallization temperature of the phase change material is about 500° C. to about 800° C., but is not limited thereto.

The phase change material layer 120 may include a pattern to prevent heat transfer from the phase change material layer 120 to the wafer substrate 110. In order to suppress heat transfer in a horizontal direction through the wafer substrate 110, the phase change material layer 120 may be formed into a pattern including a trench pattern and/or a grid pattern. For example, the phase change material layer 120 may be formed after processing the wafer substrate 110.

The support member 200 may be a member capable of supporting the wafer sensor 100. For example, the support member 200 may be a plate or a platform that supports the wafer sensor 100. A size of the support member 200 may be smaller than a size of the supported wafer sensor 100. However, the disclosure is not limited thereto, and a shape and dimension of the support member 200 may vary depending on a shape and dimension of the supported wafer sensor 100.

In some embodiment, the support member may be referred to as a chuck or a holder for holding the wafer sensor 100. For example, the support member 200 may be an electrostatic chuck, a vacuum chuck, a pin-type chuck, a groove-type chuck, an electromagnetic chuck, etc. For example, in an example case in which the support member 200 is formed as the electrostatic chuck, a voltage is applied to an electrode included in the support member 200. The voltage induces charges of opposite polarity to the wafer sensor 100 and the support member 200, thereby fixing the wafer sensor 100 including the wafer substrate 110 and the phase change material layer 120. For example, in an example case in which the support member 200 is formed as the vacuum chuck, air is sucked from a vacuum hole provided in one side of the support member 200 to generate a suction force, thereby fixing the wafer sensor 100 including the wafer substrate 110 and the phase change material layer 120.

The support member 200 may include a heater. The heater may include a conductive material capable of generating heat sufficient to change a phase of the phase change material layer 120. The support member 200 may be heated by the heater, and the generated heat may be transferred or transmitted to the wafer sensor 100. The phase change material layer 120 may be heated by the support member 200 to record or store pattern information and/or edge information based on the support member 200. For example, by heating the phase change material layer 120 using the support member 200, a pattern corresponding to the support member 200 or information corresponding to an edge of the support member 200 may be recorded in the phase change material layer 120.

The transfer device 300 may transfer the wafer sensor 100. The transfer device 300 may be used to load the wafer sensor 100 onto the support member 200. The transfer device 300 may be used to unload the wafer sensor 100 from the support member 200. The transfer device 300 may move up and down or lift up and down to perform processes of loading the wafer sensor 100 onto the support member 200 or unloading the wafer sensor 100 from the support member 200. The transfer device 300 may include, for example, a transfer robot.

According to an embodiment, the measurement device 400 may be a measurement station or may be a device provided a at measurement station. The measurement device 400 may measure changes in electrical characteristics of the phase change material layer 120 and read information stored in the phase change material layer 120. The measurement device 400 may measure a changed resistance value of the phase change material layer 120 and read the information stored in the phase change material layer 120. The measurement device 400 may measure the changed resistance value of the phase change material layer 120 and read the pattern and the edge information of the support member 200.

The measurement device 400 may measure changes in optical properties of the phase change material layer 120 and read information stored in the phase change material layer 120. The measurement device 400 may measure a change in an optical refractive index of the phase change material layer 120 and read the information stored in the phase change material layer 120. The measurement device 400 may read the pattern and the edge information of the support member 200 by scanning and profiling the phase change material layer 120, for example, by using optical equipment such as a laser.

The pattern information of the support member 200 stored in the phase change material layer 120 is transmitted to the measurement device 400. The measurement device 400 may be electrically connected to the transfer device 300. The measurement device 400 may control the transfer device 300 according to the pattern and the edge information of the support member 200 stored in the phase change material layer 120.

The measurement device 400 may uniformly change the phase throughout the phase change material layer 120. The measurement device 400 may perform a RESET operation by heating the phase change material layer 120 to a temperature higher than a reference (or a threshold) temperature. The reference temperature may be the melting temperature of the phase change material layer 120. This makes it possible to repeatedly use the wafer sensor 100 to control the transfer device 300.

Figure 3:
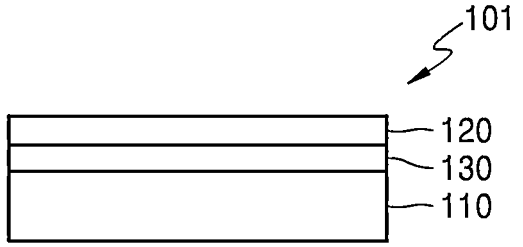
FIG. 3 is a diagram showing a wafer sensor according to another embodiment.

FIG. 3 is a diagram showing a wafer sensor 101 according to another embodiment.

Referring to FIG. 3, the wafer sensor 101 may include the wafer substrate 110, the phase change material layer 120, and a barrier layer 130. In describing FIG. 3, descriptions redundant with those of FIG. 2 are omitted.

The barrier layer 130 may be provided between the wafer substrate 110 and the phase change material layer 120. The barrier layer 130 may be provided between the wafer substrate 110 and the phase change material layer 120 to prevent heat transfer from the phase change material layer 120 to the wafer substrate 110. The barrier layer 130 may include a material with a low heat transfer coefficient to prevent heat transfer from the phase change material layer 120 to the wafer substrate 110. For example, the material may have a heat transfer coefficient lower than a reference value. The barrier layer 130 may include oxide. The barrier layer 130 may have a sufficient thickness to prevent heat transfer from the phase change material layer 120 to the wafer substrate 110.

Figure 4:
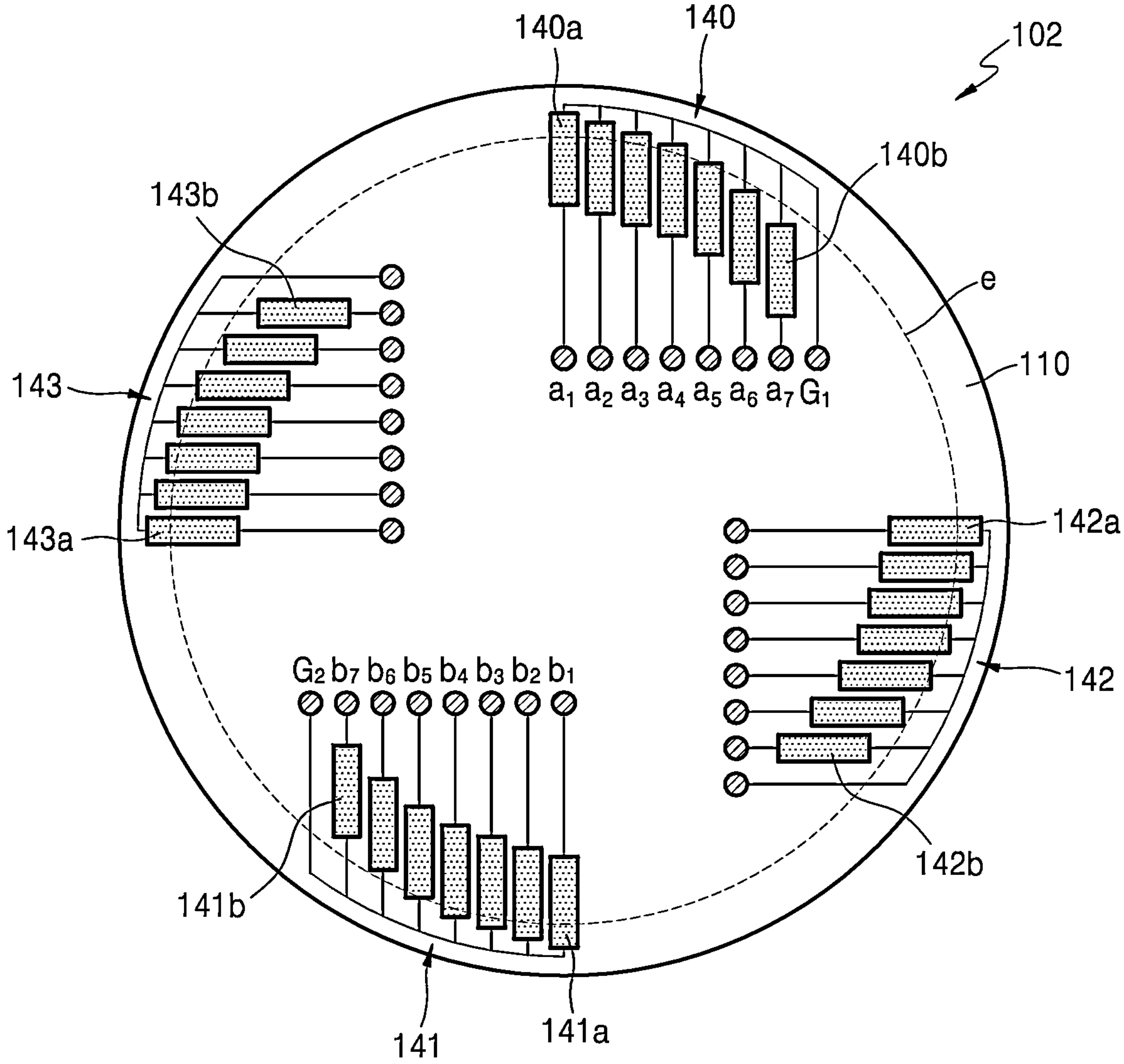
FIG. 4 is a diagram showing a wafer sensor according to another embodiment.

FIG. 4 is a diagram showing a wafer sensor 102 according to another embodiment.

Referring to FIG. 4, the wafer sensor 102 may include the wafer substrate 110, a first phase change material pattern 140 provided on the wafer substrate 110, and a second phase change material pattern 141 provided on the wafer substrate 110. The first phase change material pattern 140 may include a plurality of first phase change material portions. For example, the plurality of first phase change material portions may include a first first phase change material portion 140*a* and a second first phase change material portion 140*b*. The second phase change material pattern 141 may include a plurality of second phase change material portions. For example, the plurality of second phase change material portions may include a first second phase change material portion 141*a* and a second second phase change material portion 141*b*. In describing FIG. 4, descriptions redundant with those of FIGS. 1 to 3 are omitted.

The wafer sensor 102 may further include a third phase change material pattern 142 and a fourth phase change material pattern 143 provided on the wafer substrate 110. The third phase change material pattern 142 may include a plurality of third phase change material portions. For example, the plurality of third phase change material portions may include a first third phase change material portion 142*a* and a second third phase change material portion 142*b*. The fourth phase change material pattern 143 may include a plurality of fourth phase change material portions. For example, the plurality of fourth phase change material portions may include a first fourth phase change material portion 143*a* and a second fourth phase change material portion 143*b*. The wafer sensor 102 is shown to include the first phase change material pattern 140, the second phase change material pattern 141, the third phase change material pattern 142, and the fourth phase change material pattern 143, but is not limited thereto. The wafer sensor 102 may include, for example, three or more phase change material patterns.

In order to determine an alignment of the wafer sensor 102, a partial change in electrical characteristics of the wafer sensor 102 may be measured. For example, in order to determine the alignment of the wafer sensor 102, a partial change in resistance of the wafer sensor 102 may be measured. According to an embodiment, a degree of alignment may be obtained by comparing resistance changes at two points located in a direction of 180 degrees from each other in the first phase change material pattern 140 and the second phase change material pattern 141.

The first phase change material pattern 140 and the second phase change material pattern 141 may be provided to be symmetrical with respect to the center of the wafer substrate 110. The third phase change material pattern 142 and the fourth phase change material pattern 143 may be provided to be symmetrical with respect to the center of the wafer substrate 110. For example, the first first phase change material portion 140*a* of the first phase change material pattern 140 and the first second phase change material portion 141*a* of the second phase change material pattern 141 may be provided to be symmetrical to each other, and the second first phase change material portion 140*b* of the phase change material pattern 140 and the second second phase change material portion 141*b* of the second phase change material pattern 141 may be provided to be symmetrical to each other. However, the disclosure is not limited thereto, and as such, the first phase change material pattern 140, the second phase change material pattern 141, the third phase change material pattern 142 and the fourth phase change material pattern 143 may be arranged in a different manner. After heating the wafer sensor 102 by the support member 200, resistance changes between the first first phase change material portion 140*a* and the first second phase change material portion 141*a* and between the second first phase change material portion 140*b* and the second second phase change material portion 141*b*, which are provided to be symmetrical with respect to the center of the wafer substrate 110, may be compared, and a greater difference between the first first phase change material portion 140*a* and the first second phase change material portion 141*a* and between the second first phase change material portion 140*b* and the second second phase change material portion 141*b* may occur according to a degree of misalignment. That is, the degree of misalignment increases according to the increase in the difference. By measuring such resistance changes, the transfer device 300 may be controlled so that there is no resistance difference.

An edge e of the wafer sensor 102 is a boundary that distinguishes a portion of the wafer sensor 102 contacting the support member 200 from a portion of the wafer sensor 102 not contacting the support member 200. An inner region of the edge e (inside edge e) is a region of the wafer sensor 102 contacting the support member 200, and an outer region of the edge e (outside edge e) is a region of the wafer sensor 102 not contacting the support member 200. In other words, the inner region of the edge e is the region of the wafer sensor 102 heated by the support member 200, and the outer region of the edge e is the region of the wafer sensor 102 not heated by the support member 200.

In a case in which the differences in physical characteristics of the arrangement of the plurality of first phase change material portions (including the first first phase change material portion 140*a* and the second first phase change material portion 140*b* of the first phase change material pattern 140 are determined, the degree of alignment may be obtained by determining the boundary of the edge e of the wafer sensor 103.

The plurality of first phase change material portions may be provided along the edge e of the wafer substrate 110. Among the plurality of first phase change material portions, the first first phase change material portion 140*a* may overlap the edge e of the wafer substrate 110, and the second first phase change material portion 140*b* may not overlap the edge e of the wafer substrate 110. While the first first phase change material portion 140*a* is only partly located in the inner region of the edge e and partly heated by the support member 200, the second first phase change material portion 140*b* is wholly located in the inner region of the edge e and wholly heated by the support member 200. In the portions of the plurality of first phase change material portions that are heated by the support member 200, phases change from an amorphous high resistance state to a crystalline low resistance state. Accordingly, resistance between $a_7$ and a ground $G_1$ is lower than resistance between $a_1$ and the ground $G_1$, resulting in a difference in the resistance. Through this, the degree of alignment may be obtained by determining the boundary of the edge e of the wafer sensor 10.

Figure 5:
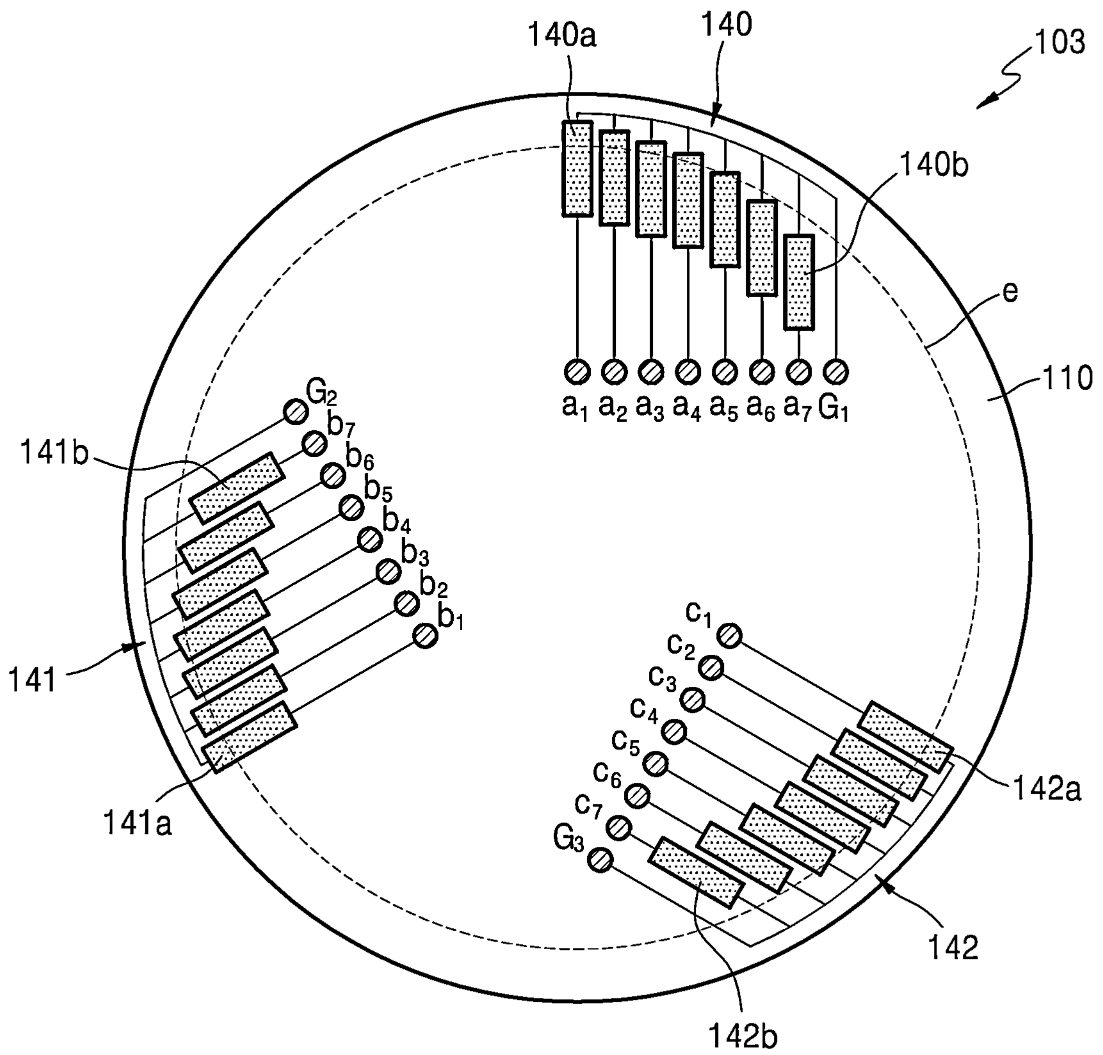
FIG. 5 is a diagram showing a wafer sensor according to another embodiment.

FIG. 5 is a diagram showing a wafer sensor 103 according to another embodiment.

Referring to FIG. 5, the wafer sensor 103 may include the wafer substrate 110, the first phase change material pattern 140 provided on the wafer substrate 110 and including the plurality of first phase change material portions, the second phase change material pattern 141 including the plurality of second phase change material portions, and the third phase change material pattern 142 including the plurality of third phase change material portions. In describing FIG. 5, descriptions redundant with those of FIGS. 1 to 4 are omitted.

In order to determine an alignment of the wafer sensor 103, a partial change in electrical characteristics of the wafer sensor 103 may be measured. In order to determine the alignment of the wafer sensor 103, a partial change in resistance of the wafer sensor 103 may be measured. According to an embodiment, a degree of alignment may be obtained by comparing resistance changes at three points spaced apart from each other by intervals of 120 degrees in the first phase change material pattern 140, the second phase change material pattern 141, and the third phase change material pattern 142.

The first phase change material pattern 140, the second phase change material pattern 141, and the third phase change material pattern 142 may be provided at intervals of 120 degrees with respect to the center of the wafer substrate 110. For example, the first first phase change material portion 140*a* of the first phase change material pattern 140, the first second phase change material portion 141*a* of the second phase change material pattern 141, and the first third phase change material portion 142*a* of the third phase change material pattern 142 may be provided at intervals of 120 degrees with respect to the center of the wafer substrate 110, and the second first phase change material portion 140*b* of the phase change material pattern 140, the second second phase change material portion 141*b* of the second phase change material pattern 141, and the second third phase change material portion 142*b* of the third phase change material pattern 142 may be provided at intervals of 120 degrees with respect to the center of the wafer substrate 110. After heating the wafer sensor 103 by the support member 200, when comparing resistance changes between the first first phase change material portion 140*a*, the first second phase change material portion 141*a*, and the first third phase change material portion 142*a* and between the second first phase change material portion 140*b*, the second second phase change material portion 141*b*, and the second third phase change material portion 142*b*, which are provided at intervals of 120 degrees with respect to the center of the wafer substrate 110, a greater difference appears according to a degree of misalignment. By measuring such resistance changes, the transfer device 300 may be controlled such that there is no resistance difference.

Figure 6:
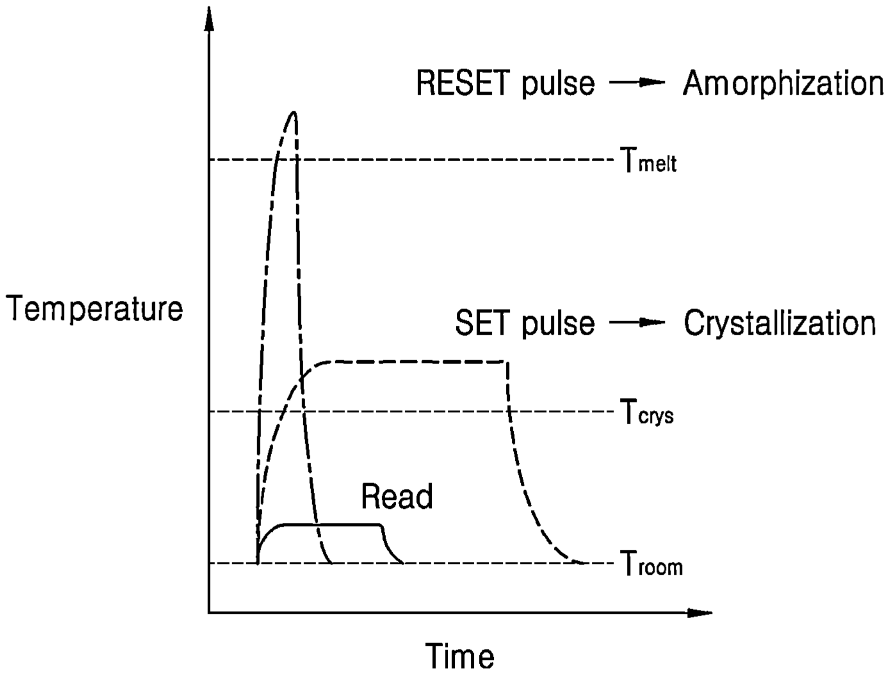
FIG. 6 is a diagram showing an application of a temperature change for controlling the phase of a phase change material.

FIG. 6 is a diagram showing an application of temperature change for controlling a phase of a phase change material.

Referring to FIG. 6, the phase of the phase change material may be changed by applying a certain temperature change to the phase change material and heating the phase change material to a temperature higher than a phase change temperature (crystallization temperature or melting temperature of the phase change material). In a SET operation using a crystallization method, a high resistance phase change material in an amorphous state may be heated to a temperature higher than the crystallization temperature and changed into a low resistance phase change material in a crystalline state. In addition, in a RESET operation using an amorphization method, the low resistance phase change material in the crystalline state may be heated to a temperature higher than the melting temperature and changed into the high resistance phase change material in the amorphous state.

Figure 7:
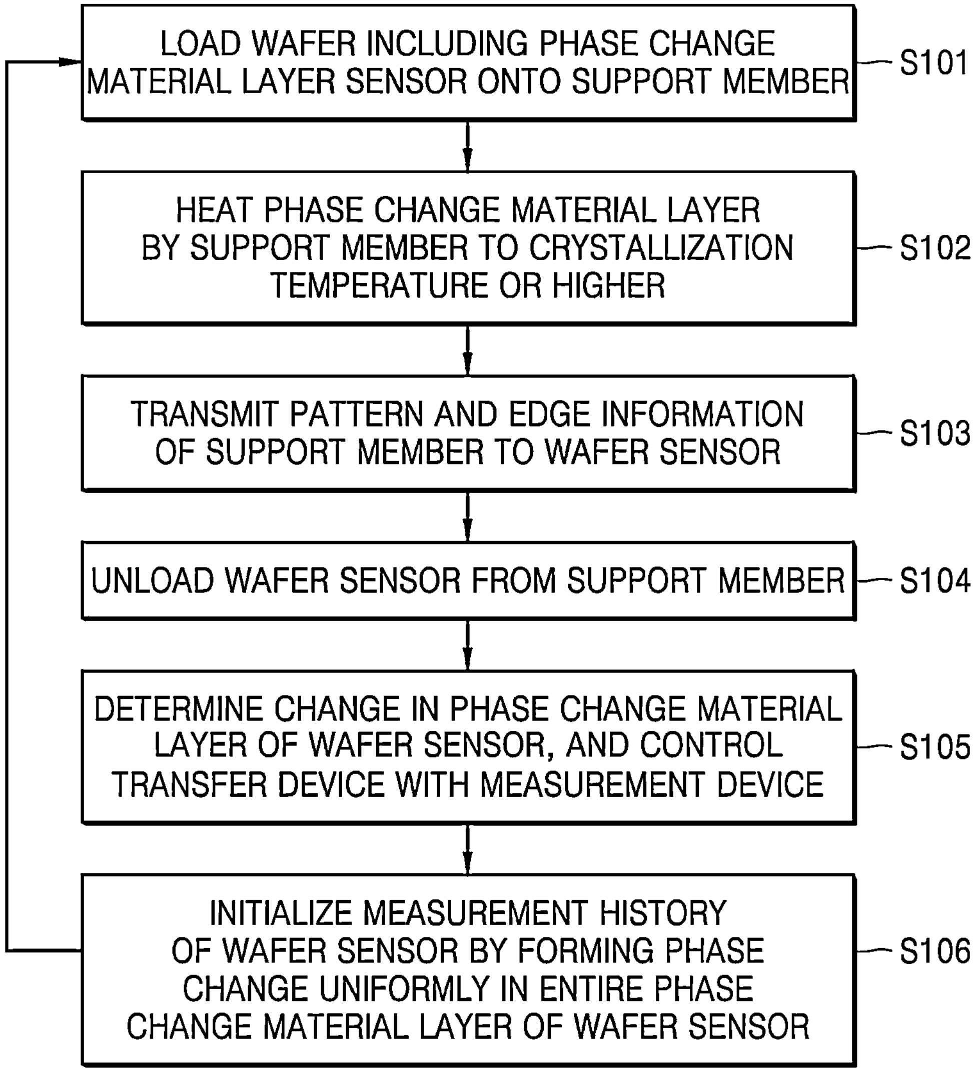
FIG. 7 is a diagram showing a wafer alignment method according to an embodiment.

FIG. 7 is a diagram showing a wafer alignment method according to an embodiment.

In operation S101, the method according to an embodiment includes loading a wafer sensor onto a support member. For example, wafer sensor may be loaded onto the support member by a transfer device. The wafer sensor includes a phase change material layer. When the wafer sensor is loaded onto the support member, the support member adsorbs the wafer sensor.

In operation S102, the method according to an embodiment includes heating the phase change material layer by the support member. The phase change material layer may be heated by the support member to a crystallization temperature or higher. The support member may include a heater for heating. When the wafer sensor including the phase change material layer contacts the support member for a certain period of time, and energy above the crystallization temperature of the phase change material layer is transmitted from the support member to the phase change material layer, the phase changes to a crystalline phase only a portion of the phase change material layer contacting the support member. In other words, a SET operation is performed to heat the phase change material in the amorphous state to the temperature higher than the crystallization temperature and change the phase change material layer in the amorphous state into the phase change material layer in the crystalline state.

In operation S103, the method according to an embodiment includes transmitting pattern and edge information of the support member are transmitted to the wafer sensor. For example, through the SET operation, the portion of the phase change material layer of the wafer sensor contacting the support member changes to crystalline, and the pattern and the edge information of the support member are recorded. The recorded pattern and edge information of the support member are transmitted to the wafer sensor.

In operation S104, the method according to an embodiment includes unloading the wafer sensor from the support member. For example, the wafer sensor may be unloaded from the chuck by the transfer device. The unloaded wafer sensor may be analyzed by a measurement station.

In operation S105, the method according to an embodiment may include obtaining the pattern and the edge information of the support member based on a change in the phase change material layer of the wafer sensor. The method may further include determining whether the wafer sensor is aligned based on the pattern and the edge information. Moreover, the method may include controlling the transfer device based on whether the wafer sensor is aligned. The measurement station determines the pattern and the edge information of the support member through a change in the phase change material layer of the wafer sensor, determines whether the wafer sensor is aligned, and then controls the transfer device. The measurement station may determine the pattern and the edge information of the support member through changes in the electrical or optical characteristics of the phase change material layer of the wafer sensor. The measurement station may determine the pattern and the edge information of the support member through a change in the resistance or optical refractive index of the phase change material layer of the wafer sensor. Relative positions of the wafer sensor and the support member may be determined, and the transfer device may be control by using the pattern and the edge information of the support member.

In operation S106, the method according to an embodiment includes resetting (or reinitializing) the wafer sensor. For example, in order to reuse the wafer sensor, a phase change may be formed uniformly throughout the phase change material layer. A RESET operation is performed to heat the phase change material layer in the crystalline state to a temperature higher than the melting temperature and change the phase change material layer the crystalline state into the phase change material layer in the amorphous state. This makes it possible to repeatedly use the wafer sensor to control the transfer device.

Again, the wafer sensor is loaded onto the support member by the transfer device, and the above process is repeated until the wafer sensor is aligned.

The wafer alignment system and wafer alignment method of the disclosure use a wafer sensor including a phase change material layer, thereby easily aligning wafers. The wafer alignment system and wafer alignment method have been described with reference to the embodiments shown in the drawings, but these are merely examples, and it will be understood by those of ordinary skill in the art that various modifications and other equivalent embodiments are possible therefrom.

According to the disclosed embodiment, a wafer alignment system including a wafer type sensor that records alignment information of the wafer sensor by using a phase change material layer and determine the alignment information outside equipment in the future, without a separate power source, and a wafer alignment method are provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A wafer alignment system comprising:
- a wafer sensor comprising a wafer substrate and a phase change material layer provided on the wafer substrate;
- a support member configured to support the wafer sensor and heat the wafer sensor; and
- a transfer device configured to transfer the wafer sensor to the support member,
- wherein the phase change material layer is configured to store pattern information and edge information of the support member based on the phase change material layer heated by the support member.

2. The wafer alignment system of claim 1, further comprising: a barrier layer provided between the wafer substrate and the phase change material layer.

3. The wafer alignment system of claim 1, wherein the phase change material layer includes GeSbTe (GST).

4. The wafer alignment system of claim 1, further comprising:
- a measurement station configured to analyze crystal information of the phase change material layer of the wafer sensor and control the transfer device.

5. The wafer alignment system of claim 4, wherein the measurement station is configured to electrically measure a change in electrical characteristics of the phase change material layer.

6. The wafer alignment system of claim 4, wherein the measurement station is configured to optically measure a change in optical characteristics of the phase change material layer.

7. The wafer alignment system of claim 4, wherein the measurement station is configured to initialize the wafer sensor by causing a phase change uniformly throughout the phase change material layer.

8. A wafer alignment system comprising:
- a wafer sensor comprising a wafer substrate, a first phase change material pattern provided on the wafer substrate, and a second phase change material pattern, the first phase change material pattern comprising a plurality of first phase change material portions and the second phase change material pattern comprising a plurality of second phase change materials;
- a support member configured to support the wafer sensor and heat the wafer sensor; and
- a transfer device configured to transfer the wafer sensor to the support member,
- wherein the wafer sensor further comprises a third phase change material pattern provided on the wafer substrate and a fourth phase change material pattern,
- wherein the third phase change material pattern comprises a plurality of third phase change material portions,
- wherein the fourth phase change material pattern comprises a plurality of fourth phase change material portions, and
- wherein the third phase change material pattern is provided to be symmetrical to the fourth phase change material pattern with respect to a center of the wafer substrate.

9. The wafer alignment system of claim 8, wherein the second phase change material pattern is provided to be symmetrical to the first phase change material pattern with respect to a center of the wafer substrate.

10. The wafer alignment system of claim 8, wherein
- the first phase change material pattern, the second phase change material pattern, and the third phase change material pattern are provided at intervals of 120 degrees with respect to a center of the wafer substrate.

11. The wafer alignment system of claim 8, wherein the plurality of first phase change material portions are provided along an edge of the wafer substrate.

12. The wafer alignment system of claim 11, wherein one or more of the plurality of first phase change material portions overlap the edge of the wafer substrate.

13. The wafer alignment system of claim 8, further comprising: a measurement station configured to analyze crystal information of the first phase change material pattern and the second phase change material pattern and control the transfer device.

14. The wafer alignment system of claim 13, wherein the measurement station is configured to electrically measure a change in electrical characteristics of the first phase change material pattern and the second phase change material pattern or optically measure a partial change in optical characteristics of the first phase change material pattern and the second phase change material pattern.

15. A wafer alignment system comprising:

a wafer sensor comprising a wafer substrate, a first phase change material pattern provided on the wafer substrate, and a second phase change material pattern, the first phase change material pattern comprising a plurality of first phase change material portions and the second phase change material pattern comprising a plurality of second phase change materials;

a support member configured to support the wafer sensor and heat the wafer sensor; and a transfer device configured to transfer the wafer sensor to the support member, wherein the wafer sensor further comprises a third phase change material pattern provided on the wafer substrate, the third phase change material pattern comprising a plurality of third phase change material portions, and wherein the first phase change material pattern, the second phase change material pattern, and the third phase change material pattern are provided at intervals of 120 degrees with respect to a center of the wafer substrate.

* * * * *